United States Patent
Ichikawa

(10) Patent No.: US 10,658,545 B2
(45) Date of Patent: *May 19, 2020

(54) LIGHT EMITTING DEVICE IN WHICH LIGHT EMITTING ELEMENT AND LIGHT TRANSMISSIVE MEMBER ARE DIRECTLY BONDED

(71) Applicant: NICHIA CORPORATION, Anan-shi, Tokushima (JP)

(72) Inventor: Masatsugu Ichikawa, Tokushima (JP)

(73) Assignee: NICHIA CORPORATION, Anan-Shi (JP)

(*) Notice: Subject to any disclaimer, the term of this patent is extended or adjusted under 35 U.S.C. 154(b) by 42 days.

This patent is subject to a terminal disclaimer.

(21) Appl. No.: 16/028,261

(22) Filed: Jul. 5, 2018

(65) Prior Publication Data
US 2018/0315892 A1    Nov. 1, 2018

Related U.S. Application Data

(60) Continuation of application No. 15/331,187, filed on Oct. 21, 2016, now Pat. No. 10,043,948, which is a (Continued)

(30) Foreign Application Priority Data
May 31, 2010 (JP) ................. 2010-123757

(51) Int. Cl.
*H01L 33/58* (2010.01)
*H01L 33/32* (2010.01)
(Continued)

(52) U.S. Cl.
CPC .......... *H01L 33/40* (2013.01); *H01L 33/0079* (2013.01); *H01L 33/32* (2013.01); *H01L 33/58* (2013.01); *H01L 33/22* (2013.01)

(58) Field of Classification Search
CPC ..... H01L 33/0079; H01L 33/22; H01L 33/32; H01L 33/40; H01L 33/58
See application file for complete search history.

(56) References Cited

U.S. PATENT DOCUMENTS

2002/0003823 A1    1/2002    Yoshida et al.
2002/0030197 A1    3/2002    Sugawara et al.
(Continued)

FOREIGN PATENT DOCUMENTS

CN    102142431 A    8/2011
EP    1 724 846 A2    11/2006
(Continued)

OTHER PUBLICATIONS

T. Akatsu et al, "Microstructure and strength of Al-sapphire interface by means of surface activated bonding method," Journals of Materials Research, 1996, vol. 12, No. 3, pp. 852-856.
(Continued)

*Primary Examiner* — Duy T Nguyen
(74) *Attorney, Agent, or Firm* — Foley & Lardner LLP

(57) ABSTRACT

Provided is a light emitting device capable of reducing light attenuation within the element and having high light extraction efficiency, and a method of manufacturing the light emitting device. The light emitting device has a light emitting element having a light transmissive member and semiconductor stacked layer portion, electrodes disposed on the semiconductor stacked layer portion in this order. The light emitting element has a first region and a second region from the light transmissive member side. The light transmissive member has a third region and a fourth region from the light emitting element side. The first region has an irregular atomic arrangement compared with the second region. The
(Continued)

third region has an irregular atomic arrangement compared with the fourth region. The first region and the third region are directly bonded.

20 Claims, 2 Drawing Sheets

Related U.S. Application Data division of application No. 13/700,936, filed as application No. PCT/JP2011/061979 on May 25, 2011, now Pat. No. 9,502,608.

(51) Int. Cl.
H01L 33/22 (2010.01)
H01L 33/40 (2010.01)
H01L 33/00 (2010.01)

(56) References Cited

U.S. PATENT DOCUMENTS

| | | |
|---|---|---|
| 2004/0163411 A1 | 8/2004 | Brady et al. |
| 2004/0164311 A1 | 8/2004 | Uemura |
| 2005/0269582 A1 | 12/2005 | Mueller et al. |
| 2006/0043402 A1* | 3/2006 | Suehiro ............. H01L 33/22 257/99 |
| 2006/0220057 A1* | 10/2006 | Shim ............. H01L 33/40 257/103 |
| 2006/0250069 A1 | 11/2006 | Sakata et al. |
| 2007/0080369 A1* | 4/2007 | Sakai ............. H01L 33/007 257/103 |
| 2008/0217647 A1 | 9/2008 | Choi et al. |
| 2008/0315176 A1 | 12/2008 | Takeuchi et al. |
| 2009/0057791 A1 | 3/2009 | Akiyama et al. |
| 2009/0206359 A1 | 8/2009 | Nabekura |
| 2010/0019260 A1 | 1/2010 | Epler et al. |
| 2010/0035406 A1 | 2/2010 | Hachigo |
| 2010/0109019 A1 | 5/2010 | Yonehara |
| 2010/0270562 A1 | 10/2010 | Ogihara |
| 2010/0270568 A1* | 10/2010 | Suzuki ............. H01L 33/0079 257/96 |
| 2010/0320479 A1* | 12/2010 | Minato ............. H01L 33/505 257/88 |
| 2011/0062413 A1 | 3/2011 | Takeuchi et al. |
| 2011/0122481 A1 | 5/2011 | Ide et al. |
| 2012/0228730 A1 | 9/2012 | Akiyama et al. |

FOREIGN PATENT DOCUMENTS

| | | |
|---|---|---|
| EP | 2 154 709 A2 | 2/2010 |
| EP | 2 182 547 A2 | 5/2010 |
| JP | S6410614 A | 1/1989 |
| JP | 10-335702 A | 12/1998 |
| JP | 2000-340509 A | 12/2000 |
| JP | 2001-077413 A | 3/2001 |
| JP | 2004-363632 A | 12/2004 |
| JP | 2006-100787 A | 4/2006 |
| JP | 2007-042664 A | 2/2007 |
| JP | 2007-157853 A | 6/2007 |
| JP | 2007-194538 A | 8/2007 |
| JP | 2008-060286 A | 3/2008 |
| JP | 2010-045098 A | 2/2010 |
| JP | 2010-114112 A | 5/2010 |
| KR | 10-20060079251 A | 7/2006 |
| KR | 10-20060130394 A | 12/2006 |
| KR | 20080109712 | 12/2008 |
| TW | 200742127 A | 11/2007 |
| WO | WO-2007/142071 A1 | 12/2007 |

OTHER PUBLICATIONS

English translation of Office Action issued in Russian Patent Application No. 2012157560 dated Aug. 26, 2014.
Extended European Search Report issued in the European Application No. 11789671.2 dated Jul. 15, 2014.
Final Office Action issued in U.S. Appl. No. 13/700,936 dated Jul. 23, 2015.
International Preliminary Report on Patentability PCT/JP2011/061979 dated Jan. 9, 2013.
International Search Report PCT/JP2011/061979 dated Aug. 2, 2011.
Non-Final Office Action issued in U.S. Appl. No. 13/700,936 dated Dec. 10, 2015.
Non-Final Office Action issued in U.S. Appl. No. 13/700,936 dated Feb. 23, 2015.
Takagi et al., "Direct bonding of two crystal substrates at room temperature by Ar-beam surface activation," Journal of Crystal Growth 292(2006) pp. 429-432.
U.S. Office Action on U.S. Appl. No. 15/331,187 dated Oct. 26, 2017.

* cited by examiner

LIGHT EMITTING DEVICE IN WHICH LIGHT EMITTING ELEMENT AND LIGHT TRANSMISSIVE MEMBER ARE DIRECTLY BONDED

CROSS-REFERENCE TO RELATED APPLICATIONS

This application is a continuation of U.S. patent application Ser. No. 15/331,187, filed Oct. 21, 2016 (now U.S. Pat. No. 10,043,948, issued on Aug. 7, 2018), which is a divisional of U.S. patent application Ser. No. 13/700,936, filed Nov. 29, 2012 (now U.S. Pat. No. 9,502,608, issued on Nov. 22, 2016), which is a U.S. National Stage Application of PCT/JP2011/061979, filed May 25, 2011, which claims priority to Japanese Patent Application No. 2010-123757, filed on May 31, 2010, the entireties of which are hereby incorporated by reference.

TECHNICAL FIELD

The present invention relates to a light emitting device having a light emitting element and a light transmissive member and a method of manufacturing the light emitting device.

DESCRIPTION OF BACKGROUND ART

Conventionally, various efforts have been conducted aiming to improve the light extraction efficiency of a light emitting device. For example, in Patent Literature 1, the p-electrode is formed as a light reflection layer to reflect light at the p-electrode and thus improve the light extraction efficiency. In Patent Literature 2, an irregularity is formed on the surface of the substrate to improve the light extraction efficiency.

Patent Literature 1: JP 2007-157853A
Patent Literature 2: JP 2008-060286A

DISCLOSURE OF INVENTION

Problem to be Solved by the Invention

However, attempts to completely extract light by using any conventional structures have not yet succeeded. That is, although a part of light is extracted to outside after a repetitive reflection between the upper and lower surfaces of the light emitting element, there has been a problem that the more the reflections occur, the more light is absorbed by the electrodes or the like, resulting in attenuation of light.

Accordingly, an object of the present invention is to provide a light emitting device capable of reducing light attenuation within the element and having high light extraction efficiency, and a method of manufacturing the light emitting device.

Means to Solve the Problems

Alight emitting device according to the present invention has, a light transmissive member, alight emitting element having a semiconductor stacked layer portion, electrodes disposed on the semiconductor stacked layer portion in this order. Particularly, the light emitting element has a first region and a second region from the light transmissive member side, and the light transmissive member has a third region and a fourth region from the light emitting element side. The first region has an irregular atomic arrangement compared with the second region, the third region has an irregular atomic arrangement compared with the fourth region, and the first region and the third region are directly bonded.

A method of manufacturing a light emitting device according to the present invention includes steps of, preparing a light emitting element having a semiconductor stacked layer portion on which electrodes are respectively disposed, preparing a light transmissive member, and directly bonding the light emitting element and the light transmissive member at a side opposite to the side where the electrodes are disposed.

Effect of the Invention

The present invention having the structure as described above is capable of providing a light emitting device capable of reducing light attenuation within the element and having high light extraction efficiency, and a method of manufacturing the light emitting device.

DETAILED DESCRIPTION OF THE EMBODIMENTS

Figure 1:
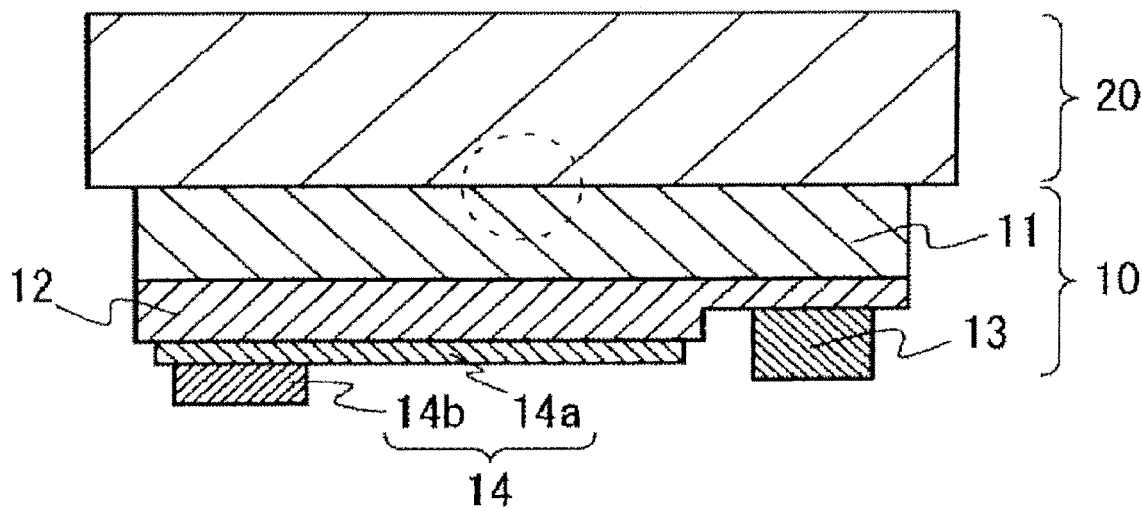
FIG. 1 is a diagram illustrating a cross section of a light emitting device according to the present invention.

The embodiments of the present invention will be described below with reference to the accompanying drawings. The embodiments are intended as illustrative of a light emitting device and a method of manufacturing the light emitting device to give a concrete form to technical ideas of the present invention, and the invention is not limited to those described below. Particularly, the sizes, materials, shapes and the relative positions of the members described in the embodiments are given as examples only and not as limitations of the invention unless specifically stated. The sizes and the positional relationships of the members in each of the drawings are occasionally shown exaggerated for ease of explanation. Members same as or similar to those of this invention are assigned the same reference numerals and detailed description thereof will be omitted.

Figure 2:
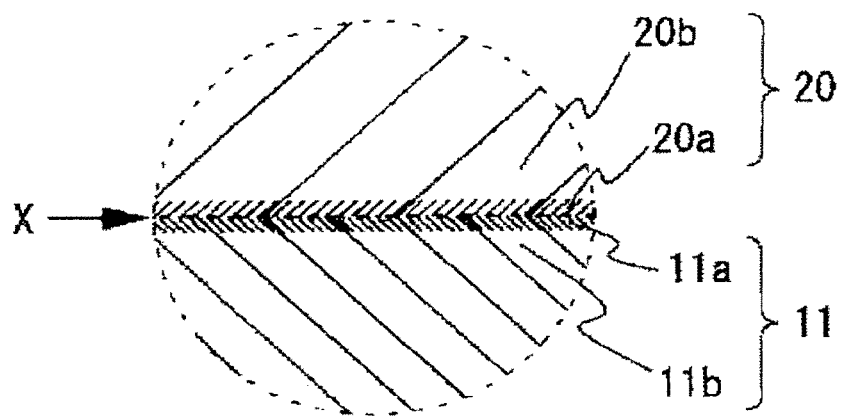
FIG. 2 is an enlarged view of the portion of FIG. 1 encircled by broken line.

FIG. 1 is a cross-sectional view in a direction perpendicular to a light emission observation surface of a light emitting device according to the present embodiment. FIG. 2 is an enlarged view of the portion of FIG. 1 encircled by broken line. As shown in FIG. 1, a light emitting device according to an embodiment of the present invention has a light transmissive member 20, a light emitting element 10 having a semiconductor stacked layer portion 12, and electrodes 13 and 14 respectively disposed on the semiconductor stacked layer portion 12 in this order. That is, the light transmissive member 20 and the electrodes 13 and 14 are arranged at opposite sides of the light emitting element 10. Further, as shown in FIG. 2, the light emitting element 10 has a first region 11a and a second region 11b from the light transmissive member 20 side and the light transmissive member 20 has a third region 20a and a fourth region 20b from the light emitting element 10 side. The first region 11a has an atomic arrangement more irregular than that in the second region 11b, the third region 20a has an irregular atomic arrangement compared with the fourth region 20b, and the first region 11a and the third region 20a are directly bonded.

The light emitting device of an embodiment constructed as described above allows to increase the thickness of the portion (a total thickness of the semiconductor stacked layer portion 12, the substrate 11, and the light transmissive member 20) in which light is repeatedly reflected, so that the amount of light to strike the electrodes 13 and 14 can be reduced. Therefore, absorption of light can be reduced mainly at the electrodes 13 and 14, so that the light extraction efficiency of the light emitting device can be improved. A detailed description will be given below.

In the case where a light transmissive member 20 is not employed, a part of light generated from the semiconductor stacked layer portion 12 is repeatedly reflected in the light emitting element 10 due to the difference in the refractive index with respect to the outside, and a part of the reflecting light is extracted to the outside. On the other hand, regardless of the material, the electrodes 13 and 14 disposed on the semiconductor stacked layer portion 12 are unable to completely reflect or transmit the light and absorb a part of the light. The absorption of light by the electrodes is such that the more times the light is reflected at the respective interfaces between the semiconductor stacked layer portion 12 and the electrodes 13 and 14, a part of the light is absorbed by the electrodes, resulting in decrease in the light extraction efficiency of the light emitting device. For this reason, the light transmissive member 20 is directly bonded to the light emitting element 10 to effectively increase the thickness of the light emitting element 10 by the thickness of the light transmissive member 20, thus enables a reduction of the number of times that the light is reflected at the interfaces with the electrodes before it is extracted to the outside. Accordingly, absorption of light by the electrodes can be reduced and thus a light emitting device having excellent light extraction efficiency can be obtained.

The light emitting elements are typically obtained by cutting a piece of wafer into a plurality of individual elements. But at the present time, in view of reproducibility and mass productivity, the thickness of the wafer is needed to be reduced to some extent at the time of cutting. For example, even in a state where the semiconductor stacked layer portion is removed by using an etching or the like and the sapphire substrate is exposed, the sapphire substrate is needed to have a thickness of a maximum of approximately 400 μm, otherwise cutting into individual units is difficult to perform. Because of the reasons described above, with the use of the substrate of unreduced thickness, individual light emitting elements cannot be obtained in the end. Therefore, the light transmissive member 20 is arranged in addition to the light emitting element 10 to effectively increase the thickness of the light emitting element 10.

In the present invention, the thickness of the light emitting element 10 is effectively increased, and in addition, it is preferable that the light transmissive member 20 has an substantially uniform refractive index and optical transmissivity and is substantially transparent to the light from the semiconductor stacked layer portion 20. In the specification, the term "light transmissive member having substantially uniform refractive index and optical transmissivity" refers to a light transmissive member which does not contain a substance capable of reflecting light, such as a fluorescent material or a diffusion agent (hereinafter simply referred to as "fluorescent material etc."), and thus allows light propagates therethrough in a straight line without being reflected or scattered. As described above, with the use of the light transmissive member 20 having substantially uniform refractive index and optical transmissivity, absorption of light by the electrodes can be reduced more effectively, so that deterioration in the light extraction efficiency can be prevented. This is because in the case where a fluorescent material etc. capable of emitting light by the light from the semiconductor stacked layer portion is contained in the light transmissive member, a part of the light is reflected toward the electrodes at the surfaces of the fluorescent material etc., which results in occurrence of absorption of light by the electrodes.

In the light emitting device according to the present embodiment, the first region 11a and the third region 20a which have irregular atomic arrangement are bonded to a single body, so that reflection at this bonded interface can be prevented. Further, the first region 11a and the third region 20a are bonded to a single body, so that strain in the interface between the light emitting element 10 and the light transmissive member 20 can be eased. Accordingly, despite the fact that the light emitting element 10 and the light transmissive member 20 are directly in contact with each other and a large thermal stress is generated between the light emitting element 10 and the light transmissive member 20 due to the heat generated in the light emitting element 10, a light emitting device having a high bonding strength can be obtained.

As described above, in the present specification, the term "first region 11a" refers to a region which is directly in contact with the wavelength converting member 20 in the light emitting element 10. Also, the term "second region 11b" refers to a region which abuts on (directly in contact with) the "first region 11a". In a same manner, the term "third region 20a" refers to a region of the wavelength converting member 20 which is directly in contact with the light emitting element 10. Also, the term "fourth region 20b" refers to a region of the wavelength converting member 20 which abuts on the "third region 20a". As described above, the first region 11a having an irregular atomic arrangement compared with the second region 11b, and the third region 20a having an irregular atomic arrangement compared with the fourth region 20b, are directly in contact with each other and bonded. Thus, a bonded interface X is formed, and the second region 11b and the fourth region 20b are respectively spaced apart from the bonded interface X. In the present specification, the first region 11a and the second region 11b (the third region 20a and the fourth region 20b) are adjacent to each other, but in the case where the members having different compositions are adjacent to each other, they are not referred to as the first region and the second region as referred to in the present invention. For example, in the case where the light emitting element has a GaN layer and an AlGaN layer from the surface side, an indication that the GaN layer is the first region and the AlGaN layer is the second region cannot be applied. That is, the first region 11a and the second region 11b (the third region 20a and the fourth region 20b) in the present specification are primarily a single member, but a part of the member is referred to as the first region and a different part of the same member is referred to as the second region. Whether a part belongs to a certain member can be determined, for example, through a cross-sectional observation at atomic level by using a high-resolution transmission electron microscope or through a comparison of composition from elemental analysis.

The first region 11a or the third region 20a, or the both regions are preferably amorphous. With this arrangement, the strain between the light emitting element 10 and the light transmissive member 20 can be further prevented.

Either the second region 11b or the fourth region 20b is preferably made of a polycrystal or a single crystal, more preferably the both are made of a polycrystal or a single crystal. In the present case, a single crystal is more preferable. In the case where the second region 11b and/or the fourth region 20b is made of a polycrystal or a single crystal (particularly a single crystal), directly bonding the second region 11b and the fourth region 20b tends to result in occurrence of strain therebetween, and in such a case, the present embodiment is particularly effective.

From a view point of reducing the strain, it is preferable that the first region 11a and the third region 20a are respectively disposed on substantially the entire area of the bonded interface X. It is needless to say that even if the region where the first region 11a and the third region 20a are directly bonded is a part of the bonded interface X, it is also in the scope of the present invention.

The first region 11a and the third region 20a respectively have a thickness of preferably 1 nm to 20 nm, further preferably 2 nm to 10 nm. With this arrangement, the effect of reducing the strain can be sufficiently obtained, so that the bonding strength can be enhanced. Further, making the first region 11a and the third region 20a with an irregular atomic arrangement may adversely affect the extraction of light, but in the range as described above, the thickness of the portion of optical attenuation can be substantially reduced, and thus optical loss can be reduced.

The portion 11 of the light emitting element 10 which is in contact with the light transmissive member is preferably made of the same material as the light transmissive member 20. For example, the substrate 11 of the light emitting element 10 is made of sapphire which can be bonded to the light transmissive member 20 made of sapphire. Also, it is possible that the GaN layer is exposed by removing the substrate 11 from the light emitting element 10 and the exposed portion is bonded to the light transmissive member made of GaN. With this arrangement, interfacial reflection due to the difference in the refractive index can be substantially eliminated. Thus, absorption of light by the electrode can be prevented and the light extraction efficiency can be further improved. Further, the substrate and the support member can be made of the same constituent elements, so that a further enhancement of the bonding strength of the both can be expected.

The light emitting element 10 is not limited and a known light emitting element can be used. For example, as shown in FIG. 1, the light emitting element 10 has a substrate 11, a semiconductor stacked layer portion 12 disposed on the substrate 11, and an n-electrode 13 and a p-electrode 14 (the p-electrode 14 is constituted with a current diffusion portion 14a and a pad portion 14b) respectively disposed on the same surface side of the semiconductor stacked layer portion 12. For the substrate 11, sapphire, GaN, or the like, can be used. For the semiconductor stacked layer portion 12, a plurality of nitride semiconductor layers ($Al_xIn_yGa_{1-X-Y}N$ ($0 \leq X \leq 1$, $0 \leq Y \leq 1$, $0 \leq X+Y \leq 1$)) including an n-layer or a p-layer or the like, can be used. In view of extraction of light, mounting in a face-down (flip-chip) manner is preferable, with which, the light transmissive member 20 side is used as the viewing side.

For the electrodes disposed on the semiconductor stacked later portion 12, a known material such as ITO, Ag, and Al can be used. For example, even with the use of Ag which has a high reflectance for a current diffusing portion 14a which occupies a relatively large area, a part of light will be absorbed by Ag and thus the light cannot be totally reflected. On the other hand, even with the use of ITO which as a high light transmissive property for the current diffusion portion 14a, a part of light will be absorbed by ITO and thus the light cannot be totally reflected. For this reason, the light transmissive member 20 is further provided to increase the thickness of the light emitting device, which enables to improve the light extraction efficiency. In the case where the light transmissive member 20 side is the viewing side, the use of a reflecting electrode such as Ag is preferable because the light can be extracted efficiently.

In the case where the light transmissive member 20 side is a viewing side, the light transmissive member 20 may be formed in a convex shape so that it can also serve as a lens. With this arrangement, a lens which is the light transmissive member 20 is directly disposed to the light emitting element 10, so that light from the light emitting element 10 can be extracted with high efficiency.

In the case where the light transmissive member 20 side is the viewing side, the area of the light transmissive member 20 at the viewing side can be larger than the bonding area of the light emitting element 10 and the light transmissive member 20 and a fluorescent material layer (not shown) can be disposed at least at the viewing side of the light transmissive member 20. With this arrangement, compare to the case where the light transmissive member 20 is not provided and a fluorescent material layer is disposed at the viewing side of the light emitting element 10, the optical density irradiated on the fluorescent material layer can be reduced, so that the life-time of the fluorescent material can be improved.

A method of manufacturing a light emitting device according to an embodiment of the present invention is shown in FIG. 3. As shown in FIG. 3, a method of manufacturing a light emitting device according to the present embodiment includes steps of, preparing a light emitting element (see FIG. 3A) 10 having a semiconductor stacked layer portion 12 on which electrodes 13 and 14 are respectively disposed, preparing a light transmissive member (see FIG. 3A) 20 which preferably does not contain a fluorescent material and is substantially uniform refractive index and reflectance, and directly bonding the light emitting element 10 and the light transmissive member 20 (see FIG. 3B and FIG. 3C) at an opposite side from where the electrodes 13 and 14 are disposed.

With this arrangement, the thickness of the light emitting element 10 can be substantially increased by the thickness of the light transmissive member 10, and thus, a light emitting device with improved light extraction efficiency can be manufactured. The details are the same as above and description thereof will be omitted below.

In the example shown in FIG. 3, the electrodes 13 and 14 are respectively disposed on the semiconductor stacked layer portion 12 in the step of preparing a light emitting element, but a step of forming electrodes (not shown) may be separately performed as a different embodiment. That is, the method may include steps of preparing a light emitting element having a semiconductor stacked layer portion, preparing a light transmissive member, directly bonding the light emitting element and the light transmissive member, and forming electrodes respectively on the semiconductor stacked layer portion at a side opposite to the side bonded to the light transmissive member. Regardless of separately arranging the step of preparing a light emitting element and the step of forming electrodes, substantially the same effect as described above can be achieved.

The portion of the light emitting element 10 which is in contact with the light transmissive member 20 is preferably made of the same material as the light transmissive member 20. With this arrangement, interfacial reflection due to the difference in the refractive index can be substantially eliminated, and thus, the light emitting device having further improved light extraction efficiency can be manufactured. Further, the substrate and the support member can be made of the same constituent elements, so that a further enhancement of the bonding strength of the both can be expected.

The technique used for bonding the light emitting element 10 and the light transmissive member 20 is not limited and a thermocompression technique, a surface activated bonding technique, or the like can be employed, and a surface activated bonding technique is preferably employed. Using a surface activated bonding technique, the light emitting element 10 and the light transmissive member 20 can be firmly bonded. This is considered that in a surface activating bonding, as the result of sputter etching, the first region 11a and the third region 20a are formed and the both absorb the strain between the light emitting element 10 and the light transmissive member 20 in an integrated manner (see FIG. 2). The details are as described above and will not be repeated here.

Figure 3A:
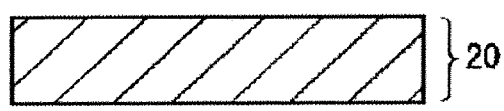
FIG. 3A is a diagram illustrating steps of preparing a light emitting element and a light transmissive member according to a method of manufacturing a light emitting device of the present invention.
Figure 3A:
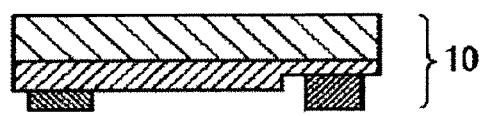
Figure 3B:
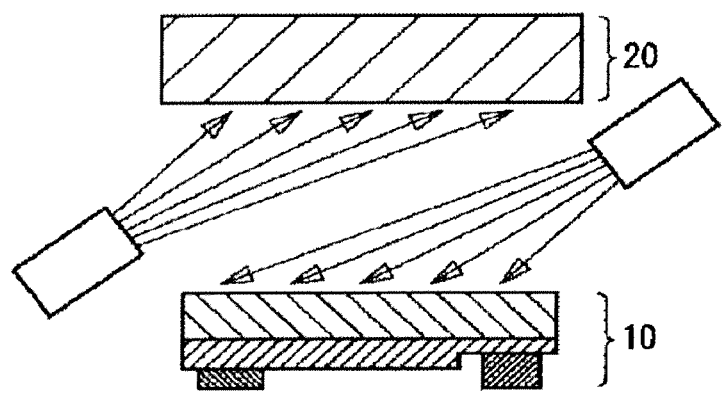
FIG. 3B is a diagram illustrating an operation of activating respective bonding surfaces of a light emitting element and a light transmissive member according to a method of manufacturing a light emitting device of the present invention.
Figure 3C:
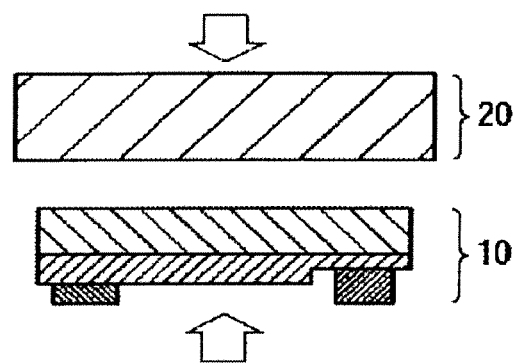
FIG. 3C is a diagram illustrating a step of bonding a light emitting element and a light transmissive member according to a method of manufacturing a light emitting device of the present invention.

In the present embodiment, the term "surface-activated bonding technique" refers to a technology that, by using ion beams or plasma, carrying out sputter etching on a bonding surface of a light emitting element 10 and a light transmissive member 20 to activate both the surfaces to be bonded, then directly bond the light emitting element 10 and the light transmissive member 20 at the bonding surfaces (see FIG. 3B and FIG. 3C). The first region and the third region are formed by sputter etching which is performed to activate the surfaces.

In the case where an amorphous first region or third region is formed on the surface of sapphire (a single crystal of aluminum oxide) by using a surface activated bonding technique, because those regions are not made of a single crystal, the surface becomes amorphous aluminum oxide instead of sapphire to be precise But in the present specification, aluminum oxide which is not a single crystal, or which is an amorphous is also referred simply to as "sapphire".

In the case where the light emitting element 10 and the light transmissive member 20 are bonded by using a surface activated bonding technique, it is preferable to use the light emitting element 10 in an individually divided state and not in a wafer state (in the present specification, not only in an individually divided state but also in a wafer state is referred to as a "light emitting element"). That is, generally, a light emitting element in a wafer state has properties such as a peak wavelength and output vary depending on the location on the wafer. However, the individual light emitting elements obtained by dividing the wafer are preferable, because the light emitting elements having the same or similar properties can be appropriately selected.

For example, firstly, each of the appropriately selected light emitting elements are arranged on a single adhesive sheet, secondly, each of the light emitting elements arranged on the adhesive sheet and a wafer-shape light transmissive member are bonded by using a surface activated bonding technique (in the present specification, not only in an individually divided state but also in a wafer state is referred to as a "light transmissive member"), thirdly, the adhesive sheet is removed, and fourthly, when needed, the light transmissive member is divided to obtain individual light emitting devices. Bonding the individually divided light emitting elements to a wafer-state light transmissive member and further dividing the light transmissive member into individual units enables to increase the thickness of the light emitting devices more easily. That is, dividing the light emitting element and the light transmissive member into individual units in a single step requires to some extent a smaller thickness to be divided. But separate dividing steps allow the light emitting devices to have a larger thickness.

On the other hand, in the case where sapphire is used for the light transmissive member and only sapphire portion is divided in a single step, the sapphire is required to have a smaller thickness to some extent to be divided into individual units. For this reason, sapphire with a thickness of 200 μm to 600 μm, preferably 300 μm to 500 μm, more preferably 350 μm to 450 μm can be used. This arrangement facilitates dividing of the light transmissive member while allowing the light transmissing member to have a sufficient thickness to improve the light extraction efficiency.

Meanwhile, heating the light emitting element may result in deterioration of the electrodes and/or the light emitting layer, but a surface activated bonding technique does not necessarily require heating. Thus, the light emitting element 10 and the light transmissive member 20 can be bonded without deteriorating the properties of the light emitting element. Although according to the materials and construction of the electrodes and the material and the construction of the semiconductor stacked layer portion, the range of temperature to perform a surface activated bonding technique may be preferably 0° C. to 300° C., more preferably 0° C. to 200° C., further preferably 0° C. to 100° C., yet further preferably 0° C. to 50° C. With this arrangement, a firm bonding can be achieved without undermining the properties of the light emitting element.

In the case where a surface-activated bonding technique is employed, the bonding surfaces of the light emitting element 10 and the light transmissive member 20 may have a surface roughness (Ra) of 10 nm or less, more preferably 5 nm or less, and further preferably 1 nm or less. Accordingly, the light emitting element 10 and the light transmissive member 20 can be easily and firmly bonded.

In the case where a surface activated bonding technique is employed, it is preferable that a portion of the light emitting element 10 which is in contact with the light transmissive member 20 is made of sapphire or GaN and the light transmissive member 20 is made of sapphire or GaN. The sapphire and GaN are both easily processed to have a smooth surface, which further facilitates application of surface activated bonding technique.

INDUSTRIAL APPLICABILITY

The light emitting device according to an embodiment of the present invention can be used, for example, for lighting devices and display devices.

DENOTATION OF REFERENCE NUMERALS

10 . . . light emitting element
11 . . . substrate

11a . . . first region
11b . . . second region
12 . . . semiconductor stacked layer portion
13 . . . n-electrode
14 . . . p-electrode
14a . . . current diffusion portion
14b . . . pad portion
20 . . . light transmissive member
20a . . . third region
20b . . . fourth region

The invention claimed is:

1. A light emitting device comprising:
a light transmissive member;
a light emitting element having a semiconductor stacked layer portion; and
electrodes respectively disposed on the semiconductor stacked layer portion, in this order;
wherein:
the light emitting element has, from the light transmissive member side, a first region and a second region,
the light transmissive member has, from the light emitting element side, a third region and a fourth region,
the first region has an irregular atomic arrangement compared with the second region,
the third region has an irregular atomic arrangement compared with the fourth region,
the first region and the third region are directly bonded, and
an area of the light transmissive member at a viewing side is larger than a bonding area of the light emitting element and the light transmissive member.

2. The light emitting device according to claim 1, wherein at least one of the first region and the third region is amorphous.

3. The light emitting device according to claim 1, wherein both of the first region and the third region are amorphous.

4. The light emitting device according to claim 3, wherein a portion of the light emitting element that is in contact with the light transmissive member is made of sapphire or GaN, and the light transmissive member is made of sapphire or GaN.

5. The light emitting device according to claim 4, wherein the portion of the light emitting element that is in contact with the light transmissive member is made of the same material as the light transmissive member.

6. The light emitting device according to claim 5, wherein the first region and the third region have a thickness of not less than 2 nm and not more than 10 nm.

7. The light emitting device according to claim 6, wherein a thickness of the light transmissive member is in a range of 350 μm to 450 μm.

8. The light emitting device according to claim 1, wherein the first region and the third region have a thickness not less than 1 nm nor more than 20 nm.

9. The light emitting device according to claim 1, wherein the first region and the third region have a thickness not less than 2 nm nor more than 10 nm.

10. The light emitting device according to claim 1, wherein a portion of the light emitting element that is in contact with the light transmissive member is made of the same material as the light transmissive member.

11. The light emitting device according to claim 10, wherein the first region and the third region have a thickness of not less than 2 nm and not more than 10 nm.

12. The light emitting device according to claim 10, wherein the light emitting element comprises a substrate having a first face on a semiconductor stacked layer portion side and a second face opposite to the first face, and wherein the first region is on a second face side of the substrate.

13. The light emitting device according to claim 1, wherein the semiconductor stacked layer portion comprises a plurality of nitride semiconductor layers.

14. The light emitting device according to claim 1, wherein the electrodes contain Ag or Al.

15. The light emitting device according to claim 1, wherein a thickness of the light transmissive member is in a range of 200 μm to 600 μm.

16. The light emitting device according to claim 1, wherein a thickness of the light transmissive member is in a range of 300 μm to 500 μm.

17. The light emitting device according to claim 1, wherein a thickness of the light transmissive member is in a range of 350 nm to d50 nm 350 μm to 450 μm.

18. The light emitting device according to claim 1, wherein the light transmissive member has a plate shape.

19. The light emitting device according to claim 1, wherein a portion of the light emitting element that is in contact with the light transmissive member is made of sapphire or GaN, and the light transmissive member is made of sapphire or GaN.

20. The light emitting device according to claim 1, wherein the light emitting element comprises a substrate having a first face on a semiconductor stacked layer portion side and a second face opposite to the first face, and wherein the first region is on a second face side of the substrate.

* * * * *

UNITED STATES PATENT AND TRADEMARK OFFICE
CERTIFICATE OF CORRECTION

PATENT NO.        : 10,658,545 B2
APPLICATION NO.   : 16/028261
DATED             : May 19, 2020
INVENTOR(S)       : Masatsugu Ichikawa It is certified that error appears in the above-identified patent and that said Letters Patent is hereby corrected as shown below:

In the Claims

Claim 17, Column 10, Line 35:
Please delete:
"range of 350 nm to d50 nm 350 μm to 450 μm."
Please replace with:
"range of 350 μm to 450 μm."

Signed and Sealed this
Eleventh Day of August, 2020

Andrei Iancu
*Director of the United States Patent and Trademark Office*